United States Patent

Yundt

[11] Patent Number: 5,162,798
[45] Date of Patent: Nov. 10, 1992

[54] RESOLVER TO DIGITAL CONVERTER

[75] Inventor: George B. Yundt, Cambridge, Mass.

[73] Assignee: Pacific Scientific Company, Newport Beach, Calif.

[21] Appl. No.: 716,699

[22] Filed: Jun. 17, 1991

[51] Int. Cl.⁵ .............................................. H03M 1/48
[52] U.S. Cl. .................................... 341/116; 341/115
[58] Field of Search ............... 341/116, 111, 112, 113, 341/114, 115, 117, 143, 118; 318/616, 615, 600, 601, 604, 605, 608

[56] References Cited

U.S. PATENT DOCUMENTS

| 3,706,923 | 12/1972 | Dunfield | 318/599 |
| 4,079,374 | 3/1978 | Cox | 341/116 |
| 5,057,759 | 10/1991 | Ueda et al. | 318/616 |

*Primary Examiner*—A. D. Pellinen
*Assistant Examiner*—B. K. Young
*Attorney, Agent, or Firm*—Schiller & Kusmer

[57] ABSTRACT

An apparatus, preferably in the form of a resolver to digital converter for converting the amplitude modulated, encoded signals into digital signals representative of the velocity and position is described. The apparatus is of the type that includes an electronic control transformer circuit for providing respective products of sine and cosine analog signals respectively times the cosine and sine of the digital position signals and for differencing the products so as to produce an analog AC error signal. The improvement comprises means for converting the analog AC error signal into a digital DC error signal and a digital accumulator for time integrating the DC error signal to generate the digital position signal. In a preferred embodiment the output of the accumulator is digitally modulated so as to provide the digital position signal as a bit-reduced feedback signal to the electronic control transformer.

10 Claims, 5 Drawing Sheets

RESOLVER TO DIGITAL CONVERTER

This invention relates to signal encoding, and more particularly to an improved digital converter of amplitude modulated and encoded analog signals.

Devices for generating digital signals representative of amplitude modulated and encoded analog signals are well known. One group of such devices includes rotary transducers that provide instantaneous information regarding angular position about an axis and means for rendering that information in digital form. Such transducers include resolvers, i.e. electromagnetically operated sensing analog devices typically combined with electronics to provide a digital output representative of a measured mechanical angle. A resolver typically comprises a rotor that generally has an input or excitation winding and a stator having a pair of output windings. The excitation winding is driven by a sine wave reference. As the rotor turns, the coupling relationship from the rotor to the stator changes correspondingly with shaft angle. In particular, the amplitudes of the voltages of the stator windings ideally respectively vary as the sine and the cosine of the shaft angle. The detailed output voltage of each output winding can be expressed mathematically by a first term that is in phase with the carrier excitation and independent of the angular velocity, and a second term that is exactly in quadrature with the carrier excitation and depends linearly on the velocity. Therefore, synchronous demodulation of the resolver output will yield signals representative of the sine and cosine of the shaft angle independently of velocity. Because the sine and cosine of an angle uniquely define that angle, then the resolver output can be decoded to measure the resolver mechanical angle independently of resolver velocity.

Because the angular position sensed by a resolver is often desired in digital form, it can be converted to that form by well-known resolver-to-digital (R/D) tracking converter electronics. Presently, R/D converters often also supply an analog signal representative of the resolver's angular velocity. For example as shown in FIG. 1 which is a block diagram of the prior art technique, the converter is provided with what is known in the art as a standard type II tracking loop, i.e. the difference between the actual resolver position $\theta_M$ and the output digital signal word $\theta_E$ (which digitally represents the actual resolver position as closely as possible within the resolution limits prescribed by the size of the quanta of the digitization interval) is calculated and the resulting output signal is doubly integrated to yield the digital position estimated output $\theta_E$. The double integration at low frequencies insures that the static position error for constant resolver angular velocity will be driven to zero, hence the type II designation.

The prior art converter shown in FIG. 1 typically comprises resolver 20 for converting a mechanical angle $\theta_M$ to an analog electrical output signal having sine and cosine components as noted above. Resolver excitation source 22 is coupled to resolver 20 for providing the desired sinusoidal carrier excitation signal to the latter. The sine and cosine components of the output of resolver 20 are fed as respective input signals to electronic control transformer 24 which is a circuit that includes a pair of specially weighted, multiplying digital-to-analog converters (MDACs) 25 and 26. Each of MDACs 25 and 26 takes a digital position estimated signal $\theta_E$ (which will be seen to be the converter digital output signal) as its digital input signal, and also accepts as an analog multiplying reference the respective sine or cosine component of the resolver output, and provides the respective products of the resolver winding voltage and the sine or cosine of the digital input, and differences them at summing circuit 28 to produce an AC error signal.

The latter signal is then preferably fed through band pass filter 30 to reduce out-of-band noise and thence to synchronous demodulator 32. Synchronous demodulator 32 is also fed with the carrier sinusoidal signal from resolver excitation source 22, so that the band pass filtered AC error signal is synchronously demodulated for the component in phase with the excitation reference. Analog loop compensation block 34 accepts the output signal from demodulator 32 and provides one stage of tracking loop integration and a stability-enhancing lead function. The analog output from block 34 is used to control the frequency of voltage controlled oscillator (VCO) 36, which in turn provides a corresponding signal to up/down counter 38 to create the digital position word $\theta_E$ and provide the second integration for the type II loop. Means are provided in the form of leads 40 for feeding $\theta_E$ back into MDACs 25 and 26. The output of analog compensation block 34 is the derivative of $\theta_E$ and thus provides an analog signal $\omega_E$ representative of the resolver angular velocity.

It will be apparent that the key to the system thus described, is the provision of control transformer 24 and synchronous demodulator 32 which combine to create a dc error signal proportional to the difference between the actual resolver position $\theta_M$ and the output digital position word $\theta_E$. Because in-phase synchronous demodulation completely rejects quadrature terms, the output of the demodulator can be expressed simply as;

$$E_{dc} = K_D A \sin(\theta_M - \theta_E) \qquad (1)$$

where $E_{dc}$ is the dc error signal;
 $K_D$ is the gain constant of the synchronous demodulator; and
 A is the amplitude of the output signal from resolver 20.

If the measured resolver angle $\theta_E$ is a good approximation of $\theta_M$, then $|(\Theta_M - \Theta_E)|$ should be small and the sine of a small angle (in radians) is very close to that angle. When the tracking loop is working well, the dc error signal $E_{dc}$ will be a good approximation of $(\Theta_M - \Theta_E)$.

Although the prior art system thus described is capable of very high performance, there are a number of aspects that can be improved. The major difficulty with this prior art system is that the higher the desired position output resolution of $\theta_E$, the larger the number of bits that control transformer 24 must accept. Because transformer 24 is a mixed, analog-to-digital circuit, it is the most complex and difficult part of a tracking R/D converter to fabricate; increasing its resolution would increase that complexity and difficulty of manufacture. Also, VCO 36 and its associated up-down counter 38 have a maximum operating frequency which, when combined with the resolution of the converter, defines a maximum resolver angular speed that the converter can track. Further, VCOS generally can be made to operate lineary only over a limited range, generally they will not have quite the same scale factor for positive inputs as for negative inputs, and there is typically an offset or a non-linearity at zero-crossing. While these VCO problems typically do not have a large adverse effect on the accuracy of the output digital position signal, they do directly affect the quality of the analog output voltage representative of the angular velocity of the resolver. Additionally, that velocity signal is usually analog, not digital, although there are a growing number of applications in which the velocity signal is needed in digital form. In principle, one could simply add a standard A/D converter to provide a digital velocity output signal, but harmonics from the synchronous demodulator often cause aliasing problems for an A/D converter and it would be more economical if the digital information was obtained directly with no unnecessary analog form.

A principal object of the present invention therefore is the provision of an improved resolver-to-digital converter for converting the analog output of an angle resolver into discrete time, digital representations of the angular velocity and position of the resolver. Another object of the present invention is the provision of an improved resolver-to-digital converter that addresses the traditional tracking loop issues and improves or solves them. Specifically then, yet other objects of the present invention are to provide such a converter in which the resolution is substantially increased over the prior art; to provide such a converter in which the trade-off between position resolution and maximum velocity has been substantially reduced or eliminated; and to provide such a converter that includes an integral digital anti-aliasing low pass-filter and to provide proper discrete time position and velocity output signals.

To these ends, the improved R/D converter of the present invention comprises an electronic control transformer circuit directly analogous to that of the prior art, but including a form of digital modulation such as pulse width modulation or noise shaping sigma-delta topology, and a sampled data or discrete time tracking loop. This invention decouples the tracking rate from the number of position resolution bits employed and eliminates the non-linearity, rate limitation and offset problems of the prior art. To implement a preferred embodiment of this improved converter, one can feed the output of the control transformer and synchronous demodulator into a noise-shaping, oversampling A/D converter, the output from the latter being fed in turn into loop compensation circuitry. Digital modulator means is connected to the output of the latter so as to provide the digital feedback into the control transformer. The digital modulator allows the number of bits in the control transformer to be greatly reduced without loss of resolution or accuracy.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims. For a fuller understanding of the nature and objects of the present invention, reference should be had to the following detailed description, wherein like numerals denote like parts, taken in connection with the accompanying drawings wherein:

Figure 1:
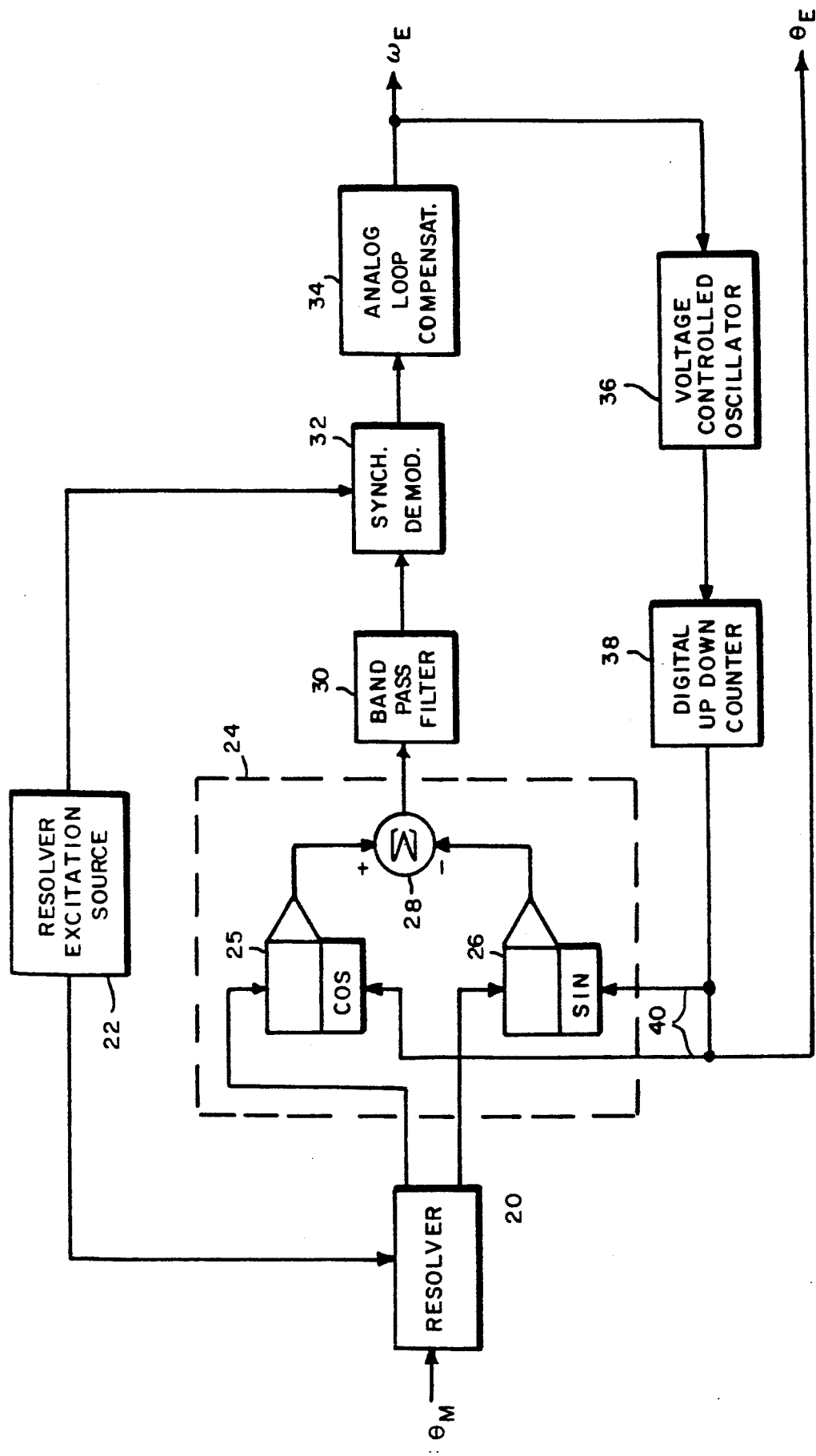
FIG. 1 is a block diagram of a prior art resolver-to-digital converter circuit.
Figure 2:
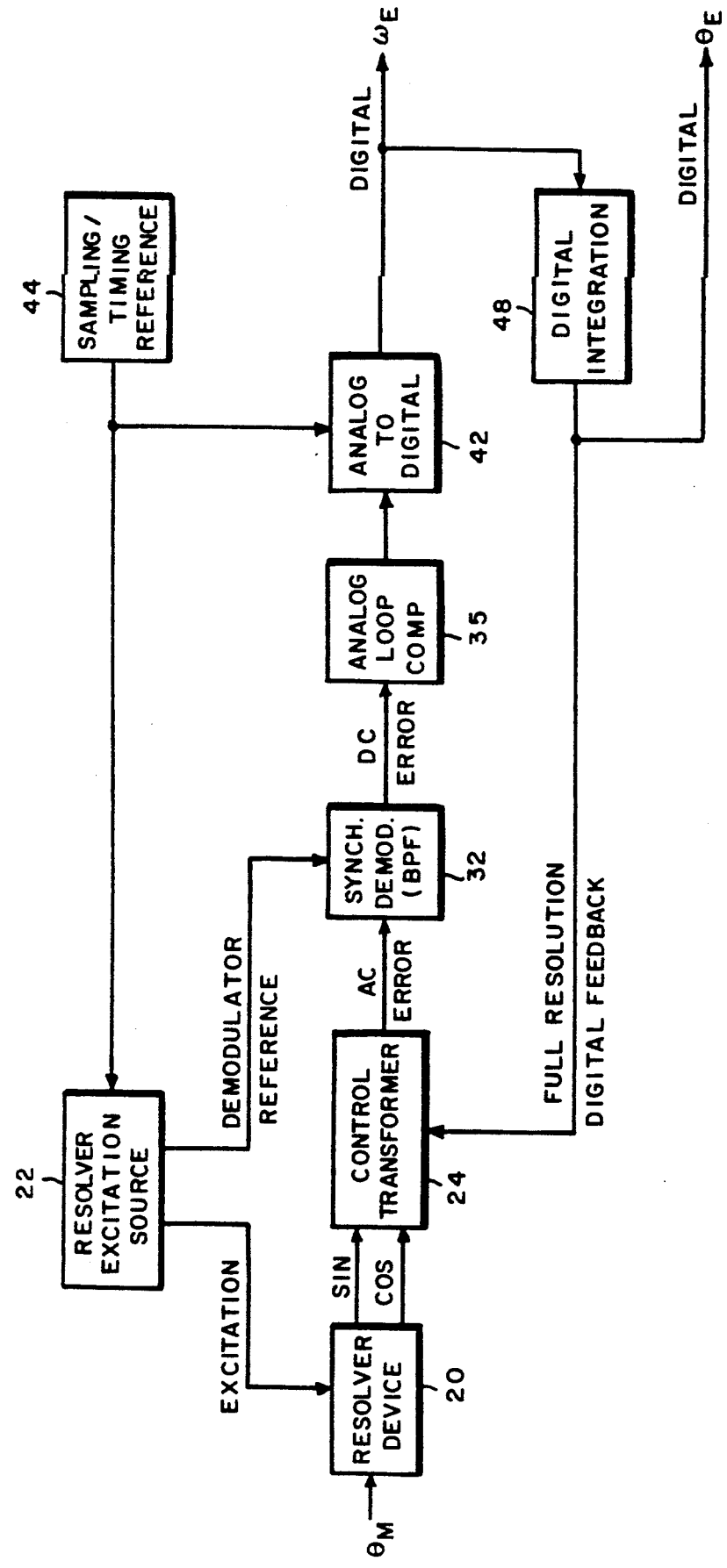
FIG. 2 is a simplified block diagram of a resolver-to-digital circuit with a discrete time tracking loop embodying the principles of the present invention.

It will be apparent that the improved R/D converter of the present invention, as shown in FIG. 2, has an overall structure incorporating many of the features of the prior art circuit heretofore described in connection with FIG. 1. Particularly, the circuit of FIG. 2 is intended to employ signals generated by resolver 20 which converts mechanical angle $\theta_M$ to an analog electrical output signal having sine and cosine components as earlier described. Resolver excitation source 22 is coupled to resolver 20 for providing the desired sinusoidal carrier excitation signal to the latter. The sine and cosine components of the output of resolver 20 are fed as respective input signals to electronic control transformer circuit 24. The latter includes a pair of specially weighted, multiplying digital-to-analog converters (not shown), each of which takes a digital position estimated signal $\theta_E$ (which will be seen to be the converter digital output signal) as its digital input signal, accepts as an analog multiplying reference the respective sine or cosine component of the resolver output, provides the respective products of the resolver winding voltage and the sine or cosine of the digital input, and differences them at summing circuit (not shown) to produce the AC error signal, as was previously described with respect to FIG. 1.

The AC error signal at the output of transformer circuit 24 is then introduced into synchronous demodulator 32 (which is basically a multiplier with preferably a band-pass filter). As in the prior art, a properly bandpass filtered AC error signal allows demodulator 32 to employ an excitation signal from excitation source 22 that can be much simpler than a pure sine wave, e.g. a $+1, -1$ square wave. The output of the demodulator is quantized in A/D converter 42 to digital form in accordance with digital discrete time sampling signals provided by sampling/timing reference source 44, those sampling signals in turn being frequency locked to the resolver excitation frequency by appropriate coupling between source 22 and reference source 44.

The output of A/D converter 42, a digital velocity signal $\omega_E$, is introduced into the input of digital accumulator or integrator 48 which provides a stage of integration and provides therefore, at its output the digital position signal $\Theta_E$. The output of integrator 48 in turn is coupled to the modulating input of control transformer 24 to complete a Type I tracking loop. Because this tracking loop is a discrete time loop, it decouples the loop from the analog input signals and solves those prior art problems arising out of the use of a voltage controlled oscillator. If a type II loop is desired, analog loop compensator 35 can include low frequency integration as in the prior art, or the second low frequency integration can be inserted between converter 42 and the digital $\Theta_E$ output.

Figure 3:
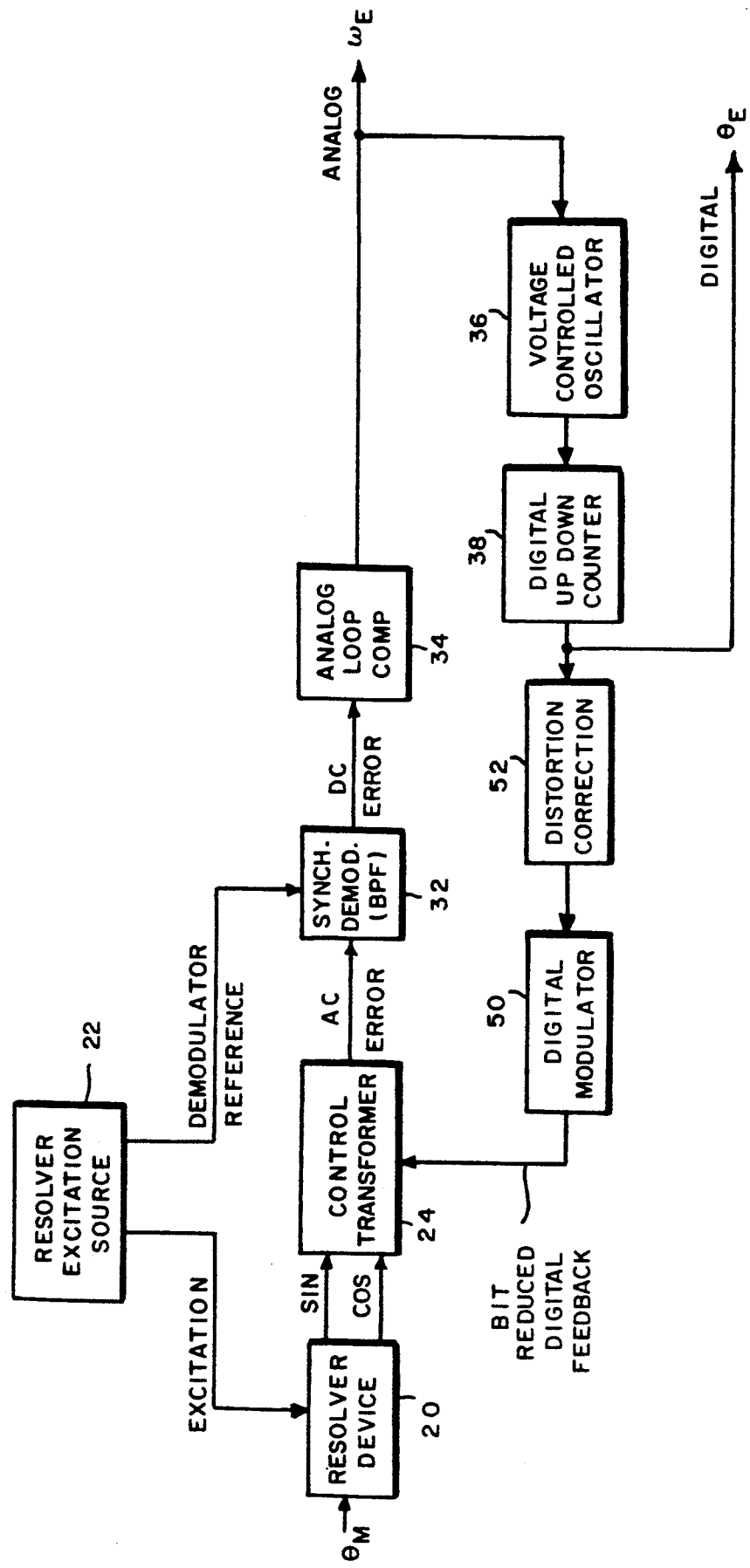
FIG. 3 is a simplified block diagram of a resolver-to-digital circuit with a digitally modulated tracking loop embodying the principles of the present invention.

Another version of an improved R/D converter of the present invention, as shown in FIG. 3, also has an overall structure incorporating many of the features of the circuits heretofore described in connection with FIGS. 1 and 2. As in the previously described circuits, the AC error signal provided by control transformer 24 is fed into synchronous demodulator 32 that preferably includes a band-pass filter. As will be described later, the input position signal $\theta_E$ fed into control transformer 24 is digitally modulated, 10 and the band-pass filter filters the effect of that modulation to base band i.e. to around the excitation frequency) before input to demodulator 32. As in the prior art, a proper band-pass filtered AC signal allows synchronous demodulator 32 to use signals simpler than pure sine waves as its reference input.

In the embodiment of FIG. 3, the output of analog loop compensation circuit 34 is an analog velocity signal $\omega_E$ that, as in the embodiment of FIG. 1, is used to control the frequency of voltage controlled oscillator (VCO) 36. In turn, the output of VCO 36 provides a corresponding signal to up/down counter 38 to create the digital position word $\theta_E$. The output of counter 38 in turn is coupled through optional distortion correction circuit 52 to the input of digital modulator 50. Lastly, the output of digital modulator 50 is connected to supply its output signal as the digital position signals coupled into the digital input terminals of the MDACs of control transformer 24.

The use of digital modulator 50 allows the number of bits used in electronic control transformer 24 to be lower than would be typical of the operation of the embodiment of FIG. 1, but without lowering the resolution of the tracking loop. Digital modulator 50 varies the value fed to control transformer 24 such that the time average of that value is the desired result with higher resolution than the number of bits provided to the control transformers input. Because control transformer 24 trigonometrically weights its digital input to perform its function, it is not obvious that simple linear modulation will maintain accuracy. But, successful bit reduction in control transformer 24 while maintaining high resolution position output allows for much easier fabrication of the overall converter.

To examine the effect of digitally modulating the input to control transformer 24, first assume that the latter has a minimum digital input quantum magnitude of $\epsilon$ and within this quantization limit, it is ideal. Then let $\theta_E$ be represented by linearly pulse width modulating the digital input to control transformer 24 (from modulator 50) between two adjacent quantum levels such that the time average of the digital code is the desired $\theta_E$, with resolution smaller than input quanta $\epsilon$, i.e. let $$\theta_E = (I+D)\epsilon \tag{2}$$

where
 I is an integer representing the integral number of $\epsilon$ quanta in $\theta_E$; and
 D is the modulation index between 0 and 1 that represents the fractional part of $\epsilon$ in $\theta_E$.

Figure 4:
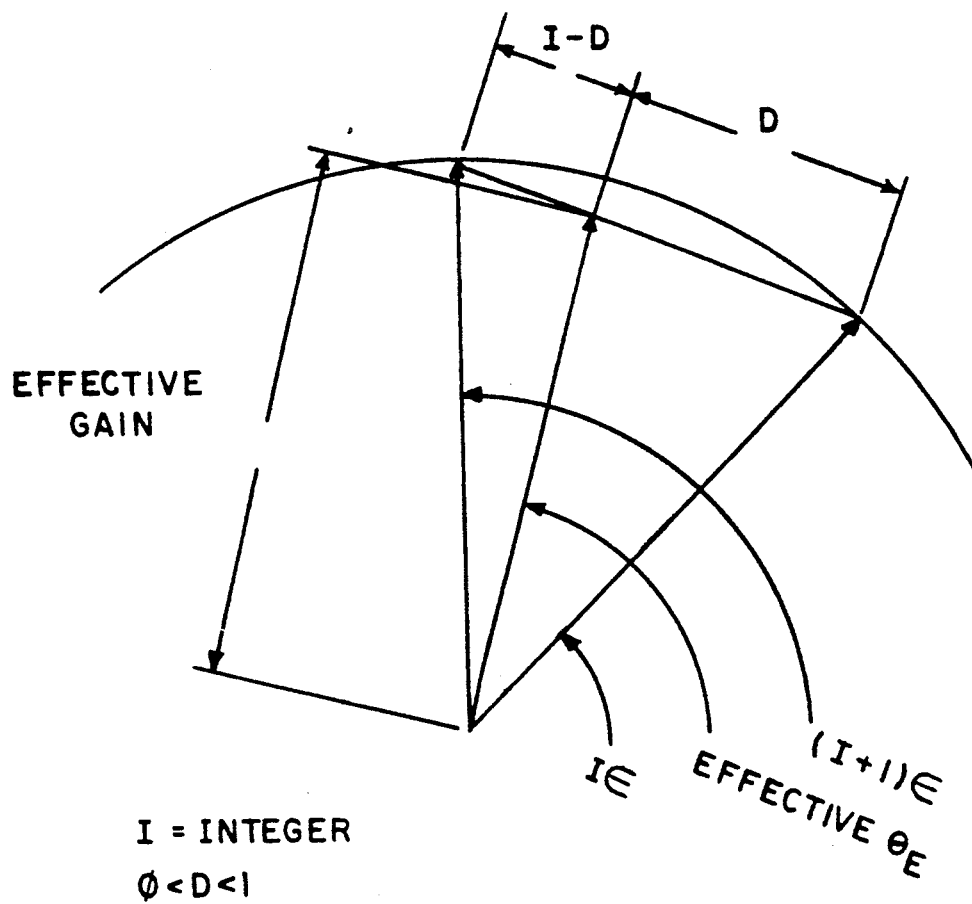
FIG. 4 is a graphical representation of the operation of a linearly modulated control transformer.

FIG. 4 vectorially illustrates the result of this linear pulse width modulation of $\theta_E$ to control transformer 24. Although the resulting effective $\theta_E$ vector is between the two adjacent $\epsilon$ quanta, the amplitude of the resulting vector is smaller than the exact values for the two adjacent quanta, and the effective angle set by the linear position along the chord connecting the two adjacent quanta is not $(I+D)\epsilon$ for all values of D. To examine these errors analytically, further assume that the SIN and COS outputs from resolver 20 are not amplitude modulated and that $\omega_M$ is zero. Then the ideal unmodulated control transformer output becomes the ideal dc error, $E_{idc}$:

$$E_{idc} = \sin(\theta_M - \theta_E) \tag{3}$$
$$= \sin[\theta_M - \epsilon(I+D)]$$

With the linear modulation, the time average of the output of control transformer 24 is the modulated dc error, $E_{mdc}$ defined as $$E_{mdc} = (1-D)\sin(\Theta_M - \epsilon I) + D\sin[\Theta_M - \epsilon(I+1)] \tag{4}$$

Defining $$\alpha = \theta_M - \theta_E,$$

then $$\begin{aligned} E_{mdc} &= (1-D)\sin(\alpha + D\epsilon) + D\sin(\alpha + D\epsilon - \epsilon) \\ &= \sin(\alpha)[(1-D)\cos(D\epsilon) + D\cos(D\epsilon - \epsilon)] + \\ &\quad \cos(\alpha)[(1-D)\sin(D\epsilon) + D\sin(D\epsilon - \epsilon)] \end{aligned} \tag{5}$$

For the ideal case, the tracking loop driving the dc error signal to zero implies $\theta_E = \theta_M$ exactly as desired. For the linearly modulated case, the tracking loop driving the time averaged dc error signal to zero has some $\Theta_E$ measurement error for $D \neq 0$, 1 or $\frac{1}{2}$. The gain of control transformer 24 also differs from the ideal value for $D \neq 0$ or 1, i.e. for a given $(\theta_m - \theta_E)$, the dc error amplitude depends on D for the linearly modulated case.

The expression for the time averaged dc error approaches the ideal result of $\sin(\alpha)$ as $|\epsilon|$ tends toward zero. It can be shown that the possible null accuracy for a linear modulated control transformer 24 is always much finer than the size of the input quanta to the control transformer. In addition, the maximum loop null error rapidly falls off as the cube of the reduction in $\epsilon$. The worst case gain variation is for $=\alpha 0$ and $D=\frac{1}{2}$ and at this operating point the incremental gain d(dc error)/$d\alpha = \cos(\epsilon/2)$. This minimum gain approaches the maximum gain of 1 as the square of the reduction in $\epsilon$.

The cubic dependence of the null error on $\epsilon$, and the square dependence of the worst case incremental gain on $\epsilon$, is made more plain by examining the power series expression of the exact trigonometric statement. The sine functions in the original modulated dc error $E_{mdc}$ expression in $\alpha$ and D can be replaced with the power series approximation of sine truncated at fourth order. The resulting approximation should be accurate as long as $(\alpha + D\epsilon)$ and $(\alpha - (1-D)\epsilon)$ are $< \approx 1$. Since this function is only of interest for a very small null error $\alpha$, the resulting expression should be fairly accurate for $|\epsilon| < 2\pi/4$ radians, as follows:

$$E_{mdc} \approx \epsilon[1 - D(1-D)\epsilon^2/2 \\ ] - \alpha^3/6 - \epsilon^3 D(1-D)(2D-1)/6 \tag{6}$$

The bracketed term shows the gain dependence on D, and the last term gives the loop null error. This approximation predicts that the worst case null error is for $D = \frac{1}{2} \pm (1/12)^{\frac{1}{2}} \approx 0.211, 0.787$. Using this worst case D yields an approximated worst case null error of $\pm 16.04 \times 10^{-3} \epsilon^3$, which for $\epsilon = 2\pi/8$ radians yields $7.77 \times 10^{-3}$ radians or 26.7 arc minutes of null error. This analytic result is identical to that often used to simplify prior art control transformers by using parallel hardware to linearly interpolate between two properly trigonometrically weighted segments.

Even though the null error when using a linearly modulated control transformer 24 may not be as low as desired for a given $\epsilon$ level, this error is entirely predictable and depends only on $\epsilon$ and D and thus is entirely defined in the digital domain. Thus, the $\theta_E$ input to digital modulator 50 is preferably modified through an inverse function provided by distortion correction circuit 52 to predistort it and cancel the null error caused by linearly modulated control transformer 24. Circuit 52 can easily be implemented using a hard-coded look-up table and a digital adder. Using this technique, it is possible to have a theoretically, arbitrarily high tracking R/D accuracy and resolution with small or large control transformer quanta. The only theoretical detriment to using less control transformer quanta levels is caused by the variation in the gain of modulated control transformer 24. Normally, gain variations in a nulling loop are not a problem, but if there is an analog offset in the tracking loop null of the dc error signal, then the variation in gain of transformer 24 would translate into a variation in the offset in the digital output $\theta_E$ that varied with the modulation index D. This variation in $\theta_E$ offset with D would, in turn, generate an undesirable ripple term in the $\omega_E$ output for constant input resolver angular velocity $\omega_M$. Because the analog null offset can be made very small, even large gain variations with D may not yield a large enough $\theta_E$ ripple term to be a problem.

For the digitally modulated system, as opposed to the prior art hardware interpolated system, one must consider the actual case where the SIN and COS outputs from the resolver are amplitude modulated and the resolver's angular velocity is not held to zero. This requirement follows from the possibility of inter-modulation of the digital modulation used to enhance the resolution of transformer 24 and the sinusoidal amplitude modulation of the SIN and COS signals from the resolver's excitation winding. For example, assume that the input $\theta_E$ to transformer 24 was square wave modulated at a fixed frequency of $2\omega_r$. The $\sin(\omega_r t)$ amplitude modulation of the SIN COS signals would mix with the digital modulation to produce a spurious ac error signal exactly at $\omega_r$. This spurious AC error signal would be passed as is by band-pass filter 30 and then demodulated in synchronous demodulator 32 to a DC offset in the DC error signal.

Note that for proper operation of any tracking converter, the frequency spectra of the input angle of the resolver must be limited. The $\theta_E(\omega)$ must equal zero for frequencies $>\omega_r/2$ or the amplitude modulation in the resolver transducer will lead to spurious SIN COS resolver output signals and the original $\theta_E(\omega)$ spectra would no longer be recoverable from the SIN COS analog outputs of the resolver. Fortunately, $\omega_r$ is set by the requirements of the resolver windings and the R/D electronics, and can usually be made much higher than the frequency of possible mechanical motions of the resolvers rotor or input shaft.

A synchronous demodulator is just a multiplier. Thus, with no band pass filter on the synchronous demodulator input, the exact time expression for the dc error signal is easily written from the earlier expressions:

$$dc\ error(t) = h(t)\{A_r\sin(\omega_r t)[\sin(\alpha(t))] - (\omega_M(t)/\omega_r)A_R\cos(\omega_r t)[\cos(\alpha(t))]\} \quad (7)$$

where $$\alpha(t) = \theta_M(t) - [I(t)\epsilon + D(t)\epsilon]$$

$h(t)$ = synchronous demodulation wave shape

Rearranging the order of multiplication, using the theoretically ideal $h(t) = \sin(\omega_r t)$ and using some trigonometric identities reduces the above to $$dc\ error(t) = (A_r/2)\{\sin(\alpha(t)) - \cos(2\omega_r t)\sin(\alpha(t)) - (\omega_M(t)/\omega_r)[\cos(\alpha(t))]\} \quad (8)$$

The first term in the above is just the quantity considered in the simplified case with no SIN COS winding amplitude modulation and with $\omega_M = 0$. For appropriate digital modulation frequency choice, the second and third terms in the above can be shown to have no spectral content for $|\omega| < \omega_r/2$. To help see this result, define the modulation signal $d(t)$ as the difference between the signal sent to the digital input of the control transformer and the position output of the converter $\theta_E(t)$. Then substitute this expression into the above expression.

$$d(t) = [I(t)\epsilon + D(t)\epsilon] - \theta_E(t) \quad (9)$$

$$\alpha(t) = \theta_M(t) - [I(t)\epsilon + D(t)\epsilon] \quad (10)$$

$$= \theta_M(t) - [\theta_E(t) + d(t)] \quad (11)$$

$$= \alpha_o(t) - d(t) \quad (12)$$

In this reformed expression the first term is still just the quantity considered in the simplified case. With a little heuristics, the second and third terms can be greatly simplified. If the loop is working at all well then $\theta_E(t)$ should be reasonably close to $\theta_M(t)$ and $|\alpha_o(t)|$ should be small. Further, if $|\epsilon|$ is small, then the Sin functions in the above can be replaced with their arguments and Cos functions reduce to just 1. With this simplification $$dc\ error(t) = (A_r/2)\{\alpha_o(t) - d(t)] - (1/\omega_r)\sin(2\omega_r t)[\omega_M(t)]\} \quad (14)$$

For the linearly pulse width modulated case, the spectrum of $d(t)$ will have non-zero amplitudes only near the modulation frequency $\omega_{pwm}$ and its harmonics. For the second term to have zero spectral amplitude for $|\omega| < \omega_r/2$ then $$[\omega_{pwm} - \omega_r/2] - 2\omega_r] > \omega_r/2 \quad (15) \text{ or}$$

$$\omega_{pwm} > 3\omega_r \quad (16)$$

The third ['ed term in the approximated dc error also has no non-zero low frequency spectral content since $\omega_M(t) = d\theta_M(t)/dt$ is band limited to below $\omega_r/2$ by assumption.

If the small angle approximation is not used to simplify the dc error(t) expression, a more involved argument analogous to that used in the small angle simplified case shows that for $\omega_{pwm} > 3\omega_r$, the second and third terms still have zero spectral content below $\omega_r/2$. Therefore, for the linearly pulse width modulated case with $\omega_{pwm} > 3\omega_r$, a sinusoidal synchronous demodulation wave shape and appropriate low pass filtering in the loop compensation will give the results shown for the simplified case of no SIN COS winding modulation and $\omega_M = 0$. In fact, this result can be extended to include nonsinusoidal synchronous demodulation techniques, i.e. h(t) ≠sine. For this case the requirements are that after any band pass filtering on the input to the synchronous demodulator there should be no significant cross modulation between remaining digital modulation harmonics and the demodulation waveform harmonics.

Figure 5:
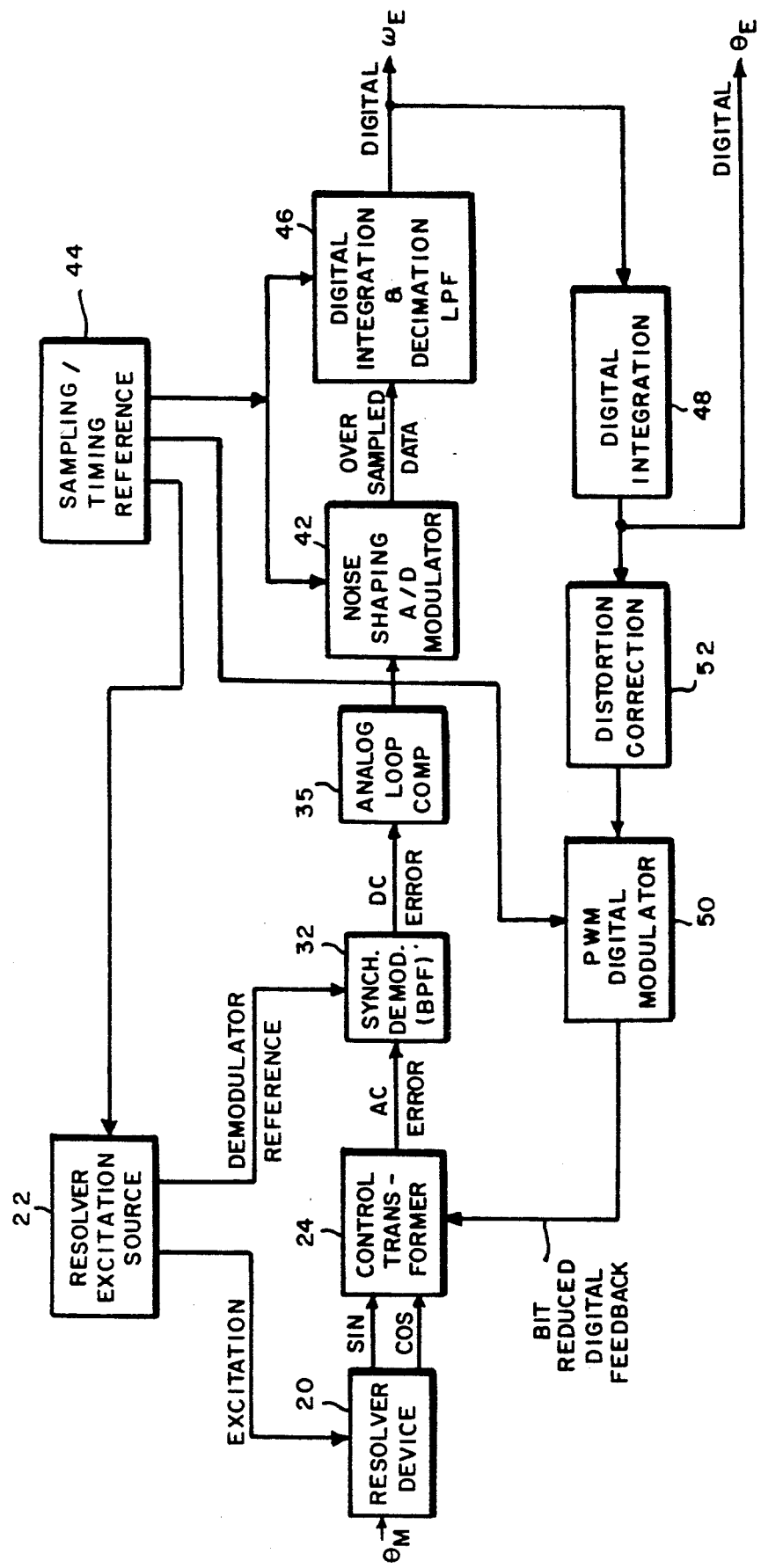
FIG. 5 is a block diagram of a preferred form of a resolver-to-digital circuit embodying the principles of the present invention.

The preferred embodiment of the present invention, as shown in FIG. 5, also incorporates many of the features of the prior art circuit heretofore described in connection with FIGS. 1, 2 and 3. The circuit of FIG. 5 is intended to introduce signals generated by resolver 20 as analog multiplying references into sine and cosine MDACs of control transformer 24, the output of the latter being an AC error signal, all as previously described. That AC error signal is then preferably fed into synchronous demodulator 32 through an input analog band-pass filter stage therein to generate the desired DC error signal. The band-pass filtered AC error signal is synchronously demodulated in demodulator 32. As in the embodiment of FIG. 3, the input position signal $\theta_E$ fed into control transformer 24 is digitally modulated, and the band-pass filter serves to filter the effect of that modulation to base band before input to demodulator 32. Loop compensation circuit 35, exemplified by a differentiating operational amplifier having a magnitude/frequency response that ramps up between two level values so as to provide a stability-enhancing lead function, accepts the DC error signal from demodulator 32, and provides an output that is then fed into the input of analog-to-digital (A/D) converter 42 to convert the signal to digital form in accordance with digital discrete time sampling signals provided by sampling/timing reference source 44. Those sampling signals in turn are frequency-locked to the resolver excitation frequency by coupling between source 22 and reference source 44. A/D converter 42 is preferably a noise-shaping, oversampling converter operating at a rate of $DF_s$ where D is an oversampling factor many times larger than the Nyquist rate. Oversampling A/D converter 42 typically will include an anti-aliasing low pass filter stage at its input.

The oversampled quantized signal output of A/D converter 42 is connected to the input of digital accumulator or integrator, and low pass filter circuit 46, such as a well-known decimator, where it is digitally low-pass filtered to suppress frequencies above $F_s/2$, and the rate is reduced to $F_s$ which is the desired sample rate for the digital $\omega_E$ outputs. The output of filter circuit 46 is connected to the input of another digital integrator 48 which provides the second stage of integration. The output of integrator 48 in turn is coupled through optional distortion correction circuit 52 to the input of digital modulator 50, the latter preferably being a linear pulse-width modulator, the modulation rate of which is controlled by signals from reference source 44 and is thus carefully synchronized with the resolver excitation frequency and the sampling frequency. If the modulation frequency is set to be an even multiple of $F_r$ (i.e. the resolver excitation frequency determined by source 22) above a required minimum of $3F_r$, reference source 44 can simply be a binary count-down chain from a high frequency source such as a crystal clock. Lastly, the output of digital modulator 50 is connected to supply its output signal as the digital estimated position signals coupled into the SIN and COS digital inputs to the MDACs of control transformer 24.

It will be appreciated that in the circuit shown in FIG. 5, the oversampled output from the A/D converter should properly convert, without aliasing, the modulation harmonics from transformer 24 and the harmonics from synchronous demodulator 32 that remain after filtering by band-pass filter 30 or its equivalent, and any higher frequency low-pass filtering in analog loop compensator 35 at the input to converter 42. Linear pulse width modulation is not the only technique for digital modulator 50 to reduce the number of bits needed in the digital input to control transformer 24. Standard sigma delta noise shaping techniques and other modulation techniques can also be used. While the expressions noted above for dc error for linear pulse width modulation are still valid in their essential characteristics, the details of the modulation signal and index would be quite different for noise shaping modulations.

It should also be appreciated that while the previously described converter loop provides an improved resolver to digital converter, the loop can be used with any other device that creates amplitude modulated and encoded analog signals that need be converted. For example, the improved converter loop can be used with synchros and LVDTs. In the latter cases, the velocity and position digital output signals would be representative of linear positions and velocities as opposed to angular position and velocity.

Since these and certain other changes may be made in the above apparatus without departing from the scope of the invention herein involved, it is intended that all matter contained in the above description or shown in the accompanying drawing shall be interpreted in an illustrative and not a limiting sense.

What is claimed is:

1. An apparatus for converting amplitude modulated analog signals into a digital signal representative of the angular position of a movable element, and including an electronic control transformer circuit for providing respective products of sine and cosine components of said analog signal respectively times the cosine and sine of said digital signal and for summing said products so as to produce an AC error signal, synchronous converter means for converting said AC error signal into a DC error signal, an analog loop compensation circuit for generating an analog signal from said DC error signal, and conversion means for converting said analog signal into said digital signal, the improvement comprising, in combination:

sigma delta noise shaping circuit means, connected to the output of said conversion means, for providing a bit-reduced form of said digital signal as feedback to said control transformer so as to enhance the resolution of said control transformer.

2. Apparatus as defined in claim 1, further including distortion correction means for correcting distortion, said distortion correction means being connected between the output of said conversion means and the input of said sigma delta noise shaping circuit means.

3. Apparatus as defined as claim 2, wherein said distortion correction means includes means for modifying said digital position signal as an inverse function of distortion caused by said control transformer circuit and said sigma delta noise shaping circuit means.

4. An apparatus for converting amplitude modulated analog signals into a digital signal representative of the position and a digital signal representative of the velocity of a movable element, and including an electronic control transformer circuit for providing respective products of sine and cosine components of said analog signal respectively times the cosine and sine of said digital signal and for summing said products so as to produce an AC error signal, synchronous converter means for converting said Ac error signal into a DC error signal, an analog loop compensation circuit for generating an analog signal from said DC error signal, and conversion means for converting said analog signal into a digital velocity signal, the improvement comprising, in combination:

noise-shaping, oversampling A/D converter means connected to the output of said analog lop compensation circuit;

digital decimation filter means connected to the output of said A/D converter means for converting the oversampled output from said A/D converter means to a digital velocity signal representative of the velocity of said element;

digital integration means connected to the output of said digital decimation filter means so as to provide said digital position signal; and digital modulator means connected to the output of said digital integration means so as to provide a bit-reduced form of said digital position signal as feedback to said control transformer, thereby enhancing the resolution of said control transformer.

5. Apparatus as defined in claim 4, further including distortion correction means for correcting distortion, said distortion correction means being connected between the output of said digital integration means and the input of said digital modulator means.

6. Apparatus as defined as claim 5, wherein said distortion correction means includes means for modifying said digital position signal as an inverse function of distortion caused by said control transformer circuit and said digital modulator means.

7. Apparatus as defined in claim 4, wherein said decimation filter includes a first integration stage of a type II tracking loop so that the output signal from said decimation filter is a digital representation of said velocity of said moveable element; and said apparatus includes a second stage for integrating said digital representation of said velocity to provide a second signal that is a digital representation of said position of said movable element and constitutes said digital feedback signal.

8. Improved apparatus as defined in claim 7, including means for synchronously supplying said demodulation waveform to said synchronous demodulator, said excitation signals to said resolver and said oversampling signals to said analog-to-digital converter.

9. Improved apparatus as defined in claim 4, wherein said digital modulation means comprises a pulse width modulator.

10. Improved apparatus for converting the analog output signals from an angle resolver excited by excitation signals, into digital signals representation of the velocity and position of a rotor of said resolver, said apparatus including, in combination:

electronic control transformer circuit means for providing respective products of sine and cosine components of said analog signal respectively times the cosine and sine of said digital signal and for summing said products so as to produce an analog error signal;

analog band pass filter means for suppressing any frequency component in said analog error signal outside of a critical frequency range, for passing frequencies within said critical frequency range with substantially flat frequency response, and rolling off between these two behaviors over a transition band;

means for synchronously demodulating the band pass filtered analog error signal;

analog-to-digital converter means, responsive to digital discrete oversampling signals, for converting the demodulated analog error signal into oversampled digital form;

decimator means for digitally low-pass filtering the oversampled quantized signal output of said converter means so as to suppress frequencies above one-half of the desired discrete time sample frequency and including first digital accumulator means for integrating said output of said converter means, the output signal from said decimator means being said digital velocity signal;

second digital accumulator means connected to the output of said decimator means for providing a second stage of integration for said apparatus; and digital modulation means connected to accept the output signals from said second digital accumulator means, the modulation rate of said digital modulation means being controlled responsively to a modulation waveform so as to provide said position signal.

* * * * *

UNITED STATES PATENT AND TRADEMARK OFFICE
CERTIFICATE OF CORRECTION

PATENT NO. : 5,162,798
DATED : November 10, 1992
INVENTOR(S) : George B. Yundt It is certified that error appears in the above-identified patent and that said Letters Patent is hereby corrected as shown below:

Claim 3, column 10, line 57, delete "as" (second occurrence), and substitute therefor -- in --;

Claim 4, column 11, line 3, delete "Ac", and substitute therefor -- AC --;

Claim 4, column 11, line 10, delete "lop", and substitute therefor -- loop --;

Claim 6, column 11, line 31, delete "as" (second occurrence), and substitute therefor -- in --; and Claim 10, column 12, line 8, delete "representation", and substitute therefor -- representative --.

Signed and Sealed this

Twelfth Day of October, 1993

Attest:

BRUCE LEHMAN

*Attesting Officer*            *Commissioner of Patents and Trademarks*